United States Patent
Schoch

(10) Patent No.: US 6,943,528 B2
(45) Date of Patent: Sep. 13, 2005

(54) METHOD AND ARRANGEMENT FOR DETERMINATION OF THE STATE OF CHARGE OF A BATTERY

(75) Inventor: Eberhard Schoch, Stuttgart (DE)

(73) Assignee: Robert Bosch GmbH, Stuttgart (DE)

( * ) Notice: Subject to any disclaimer, the term of this patent is extended or adjusted under 35 U.S.C. 154(b) by 127 days.

(21) Appl. No.: 10/181,312
(22) PCT Filed: Nov. 8, 2001
(86) PCT No.: PCT/DE01/04197
§ 371 (c)(1),
(2), (4) Date: Oct. 8, 2002
(87) PCT Pub. No.: WO02/41014
PCT Pub. Date: May 23, 2002

(65) Prior Publication Data
US 2003/0052690 A1 Mar. 20, 2003

(30) Foreign Application Priority Data
Nov. 17, 2000 (DE) .......................... 100 56 969

(51) Int. Cl.⁷ ................................. H02J 7/00
(52) U.S. Cl. ........................ 320/132; 320/130
(58) Field of Search .................. 320/132, 130, 320/134, 136, 137, 149, 151, 152, 127, 128; 324/426, 430, 433, 425

(56) References Cited

U.S. PATENT DOCUMENTS

| | | | | |
|---|---|---|---|---|
| 4,390,841 A | * | 6/1983 | Martin et al. ............... | 324/427 |
| 5,349,540 A | | 9/1994 | Birkle et al. ................ | 364/578 |
| 5,381,096 A | | 1/1995 | Hirzel ......................... | 324/427 |
| 5,937,622 A | * | 8/1999 | Carrier et al. ............... | 56/11.9 |

FOREIGN PATENT DOCUMENTS

| DE | 35 20 985 | 12/1986 |
|---|---|---|
| DE | 199 50 919 | 5/2001 |

* cited by examiner

Primary Examiner—Donald Sparks
Assistant Examiner—Lawrence Luk
(74) Attorney, Agent, or Firm—Kenyon & Kenyon

(57) ABSTRACT

Method of determining the state of charge soc of a battery, in particular a starting battery of a motor vehicle; the state of charge being calculated, in a first operating range, on the basis of a model calculation in which a measured and a calculated battery voltage $U_{Batt}$, $U_{Batt}$, are balanced, using feedback.

15 Claims, 1 Drawing Sheet

METHOD AND ARRANGEMENT FOR DETERMINATION OF THE STATE OF CHARGE OF A BATTERY

FIELD OF THE INVENTION

The present invention relates to a method and an arrangement for determining the state of charge of a battery, in particular the starting battery of a motor vehicle.

BACKGROUND INFORMATION

Several methods are known to determine the state of charge of starting batteries in motor vehicles. Exemplary methods should be noted, which determine the state of charge via the measurable charge-proportional off-load voltage of a battery which has been idle for a longer period of time, typically four to five hours, using current integration and re-calibration. A method of this type is described in German Patent No. 35 20 985. Furthermore, model-based methods should be noted, which make it possible to determine the off-load voltage and therefore also the state of charge derivable from this off-load voltage, for a battery under load via adaptation of a model to the actual battery using the aid of sensor variables, such as battery voltage, battery current, and/or battery temperature.

The above-mentioned methods are relatively simple to implement; however, they result in errors during long operating phases of the vehicles, having relatively short or only few rest periods (e.g. taxi operations), because the state of charge may only seldom be re-calibrated or corrected via a measurement of the off-load voltage.

Model-based methods, in contrast, do not rely on rest periods for re-calibration, and the implementation of such methods, depending on the complexity of the underlying battery model, is relatively complex.

SUMMARY OF THE INVENTION

The present invention intends to provide a simple and less complex battery charge detection system for starting batteries in motor vehicles, in particular batteries which are used in vehicle operations without rest periods, for example in taxi operations.

According to the present invention, a simple battery model is used for re-calibration of the current integration. Because of the simple model approach having few parameters, the utilized estimation procedure for the state of charge may also be used simultaneously for the estimation of unknown parameters without the need for a separate parameter estimator, as described in German Published Patent Application No. 199 50 919, for example.

In contrast to known model-based methods for determining the state of charge, which operate with complex battery models covering a wide dynamic range as well as a wide operating range with regard to temperature, current, and state of charge, according to the present invention a model is used which only takes into account time constants on the order of magnitude of minutes and hours. This makes it possible to keep the model simple, having only few parameters to be determined.

The described method is advantageously only activated in a valid operating range of the model.

The first operating range in which the method is implemented is expediently defined as one where a minimum battery current $I_{Batt,min}$ is exceeded. The limitation of the model, used according to the present invention, to this operating range, i.e., the discharge range of the battery is acceptable with regard to applications for monitoring a minimum state of charge and in practice produces satisfactory results.

Off-load voltage of the battery from which the battery condition is derivable is advantageously calculated on the basis of the model calculation. Such relationships between off-load and state of charge of the battery are known per se and do not require further explanation.

Battery condition soc is expediently determined according to a function of the following formula $$soc=f(U_R)=(U_R-U_{R,min})/(U_{R,max}-U_{R,min}) \quad (1)$$

Where $U_{R,min}$ and $U_{R,max}$ represent the minimum and maximum off-load voltages, respectively, according to the acid density values for a dead and a fully charged battery provided by the battery manufacturer.

According to a particularly advantageous embodiment of the present invention, the determination of the state of charge is carried out on the basis of a measurement of the battery current and a latest calculated or estimated off-load voltage $U_{RO}$ if a second operating range of the battery is present. If the current integral is formed according to formula $Q=-\int I_{Batt} dt$, it is possible to calculate in this way an instantaneous off-load voltage $U_R$ according to an equation of the formula $U_R=U_{RO}+Q/C$. Here it is also possible to calculate the instantaneous state of charge on the basis of equation (1) mentioned above.

It is expediently assumed that a second operating range is present if the battery current is less than the minimum battery current $I_{Batt,min}$.

Because of the distinction that is made between the two operating ranges mentioned, where $I_{Batt}>I_{Batt,min}$ applies for the first range, and $I_{Batt}<=I_{Batt,min}$ applies to the second range, an adequate assessment of the state of charge across the entire battery operating range is possible.

Additional advantages of the present invention arise from the following description of preferred embodiments.

DETAILED DESCRIPTION

Figure 1:
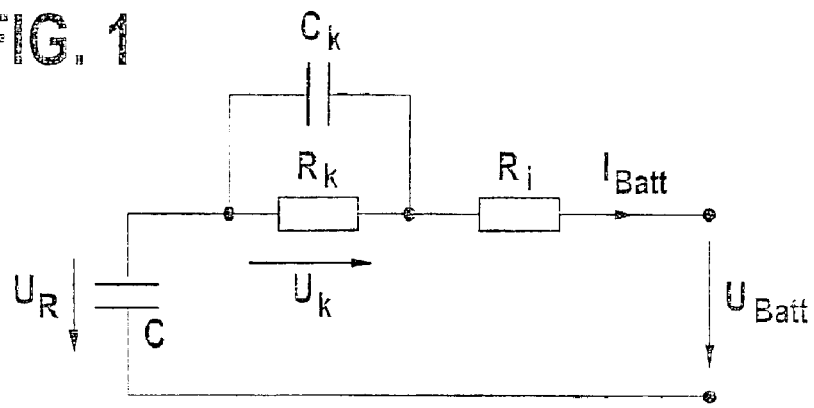
FIG. 1 shows an electrical equivalent circuit diagram of a battery.

An electrical equivalent circuit diagram of a battery with which the method according to the present invention is applicable is illustrated in FIG. 1. Here capacitor C describes the almost linear relationship between charge Q of the battery and off-load voltage $U_R$ of the battery. Via capacitor $C_K$ and resistor $R_K$, concentration overvoltage $U_K$ emulates the dynamics of the acid density compensation between the plate pores and the free acid volume. Internal resistance $R_i$ of the battery includes the ohmic resistances of electrodes and electrolyte as well as the transition resistance of the double layer between electrodes and electrolyte. Finally, $I_{Batt}$ indicates battery current or discharging current and $U_{Batt}$ indicates battery voltage.

Figure 2:
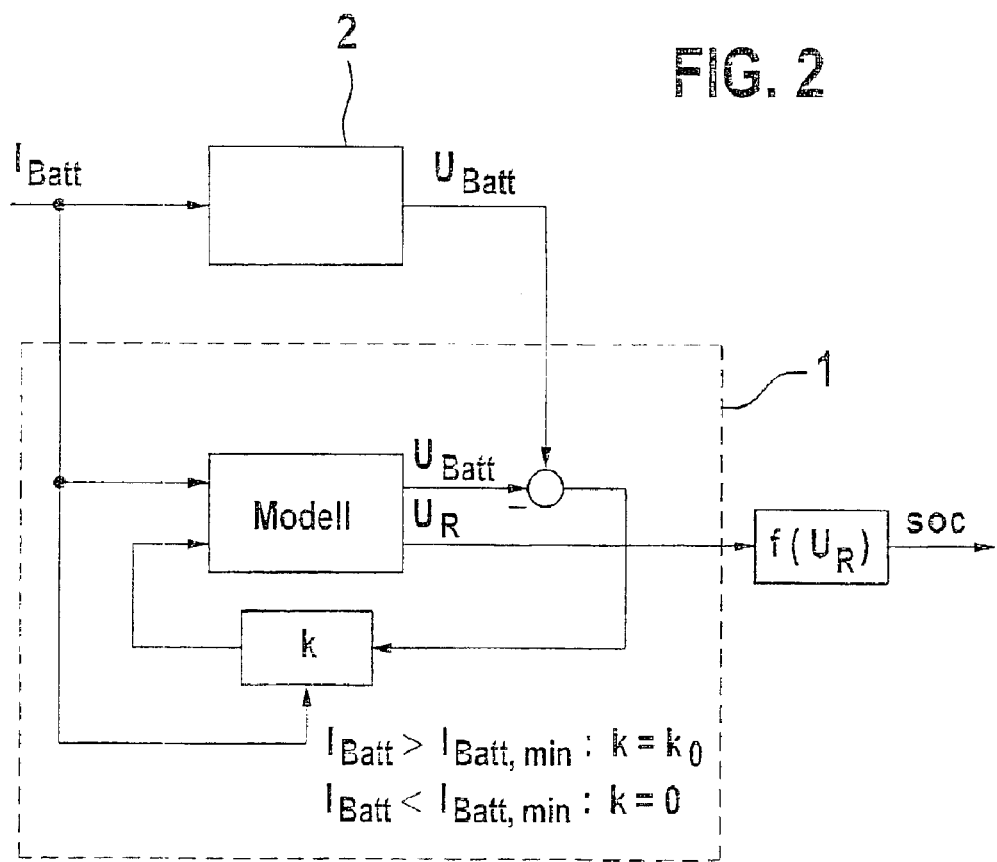
FIG. 2 shows a schematic block diagram to illustrate the battery charge detection system provided according to the present invention.

The method according to the present invention is explained further with reference to FIG. 2. A battery is indicated here using reference symbol 2. Battery 2 has a battery current $I_{Batt}$ and a battery voltage $U_{Batt}$ which are measured. As illustrated, battery current $I_{Batt}$ is input into a model calculation. Adjusted with a calculated or estimated battery voltage $U_{Batt}$, battery voltage $U_{Batt}$ is adjusted and is likewise input into the model as an input quantity.

The state of charge of the battery is determined using off-load voltage value $U_R$ calculated in this manner, as further explained below.

First, it is assumed that battery current $I_{Batt}$ is greater than minimum battery current $I_{Batt,min}$, i.e., the battery is in its discharging operating range. In this operating range, in order to estimate off-load voltage $U_R$, concentration overvoltage $U_K$ as well as internal resistance $R_j$, a monitor is utilized, for example in the form of a Kalman filter 1 (dashed-line frame). For this purpose the utilized model is adjusted by feeding back the error $U_{Batt}-U_{Batt}$ between the measured and calculated battery voltage. If, for example, parameters C, $R_K$ and $C_K$ are unknown they may also be included in the estimation after a battery replacement.

As mentioned before, model adjustment only takes place at the operating points relevant for model validity, i.e., for $I_{Batt}>I_{Batt,min}$ (discharging current >0). In this case it means that a value $k=k_0=U_{Batt}-U_{Batt}$ is input into the model calculation.

In the other operating points for which $I_{Batt}\leq I_{Batt,min}$ applies, the feedback of the error into the model calculation is interrupted, i.e., k is set equal to 0. In this second operating range, off-load voltage $U_R$ is calculated using current integral $Q=-\int I_{Batt}dt$ and off-load voltage $R_0$ is estimated last, in particular in the first operating range, according to the equation $U_R=U_{RO}+Q/C$.

In both operating ranges, off-load voltage value $U_R$ resulting from the calculation is subjected to another mathematical operation, in order to obtain battery condition soc (State of Charge). The battery condition is expediently determined according to an equation of the formula $$soc=f(U_R)=(U_R-U_{R,min})/(U_{R,max}-U_{R,min}).$$

As already mentioned, $U_{R,min}$ and $U_{R,max}$ indicate the minimum and maximum off-load voltages for the acid density values of a dead and a fully charged battery, according to the battery manufacturer.

What is claimed is:

1. A method of determining a state of charge of a battery, comprising:
    performing a model calculation in which a measured battery voltage and a calculated battery voltage are adjusted using feedback;
    in a presence of a first operating range of the battery, calculating the state of charge on the basis of the model calculation;
    calculating, on the basis of the model calculation, an off-load voltage $U_R$ from which the state of charge of the battery is derivable; and
    in a presence of a second operating range of the battery, determining the state of charge on the basis of a measurement of a battery current and an off-load voltage that are one of calculated and estimated last,
    wherein the state of charge of the battery is calculated according to the formula state of charge =$f(U_R)=(U_R-U_{R,min})/(U_{R,max}-U_{R,min})$.

2. The method according to claim 1, wherein:
    the battery includes a starting battery of a motor vehicle.

3. The method according to claim 1, wherein:
    the first operating range is present if one of a battery current and a discharging current is greater than a minimum battery current.

4. A method of determining a state of charge of a battery, comprising:
    performing a model calculation in which a measured battery voltage and a calculated battery voltage are adjusted using feedback; and
    in a presence of a first operating range of the battery, calculating the state of charge on the basis of the model calculation;
    wherein the state of charge of the battery is calculated according to the formula state of charge =$f(U_R)=(U_R-U_{R,min})/(U_{R,max}-U_{R,min})$.

5. The method according to claim 4, wherein:
    the battery includes a starting battery of a motor vehicle.

6. The method according to claim 4, wherein:
    the first operating range is present if one of a battery current and a discharging current is greater than a minimum battery current.

7. A method of determining a state of charge of a battery, comprising:
    performing a model calculation in which a measured battery voltage and a calculated battery voltage are adjusted using feedback;
    in a presence of a first operating range of the battery, calculating the state of charge on the basis of the model calculation; and
    in a presence of a second operating range of the battery, determining the state of charge on the basis of a measurement of a battery current and an off-load voltage that are one of calculated and estimated last.

8. The method according to claim 7, wherein:
    the battery current and the off-load voltage are one of calculated and estimated last in the presence of the first operating range.

9. The method according to claim 7, wherein:
    the second operating range is present when the battery current is no more than a minimum battery current.

10. The method according to claim 7, wherein:
    the battery includes a starting battery of a motor vehicle.

11. The method according to claim 7, wherein:
    the first operating range is present if one of a battery current and a discharging current is greater than a minimum battery current.

12. An arrangement for determining a state of charge of a battery, comprising:
    a monitoring device that determines the state of charge of the battery by calculating an off-load voltage in a first operating range of the battery, on the basis of a model calculation in which a measured battery voltage and a calculated battery voltage are balanced by feedback, the monitoring device further determining the state of charge of the battery in a second operating range, on the basis of a measurement of a battery current and an off-load voltage that are one of calculated and estimated last.

13. The arrangement according to claim 12, wherein.
    the battery includes a starting battery of a motor vehicle.

14. The arrangement according to claim 12, wherein:
    the monitoring device includes a Kalman filter.

15. The arrangement according to claim 12, wherein:
    the battery current and the off-load voltage are one of calculated and estimated last in the presence of the first operating range.

* * * * *